United States Patent
Ting et al.

(10) Patent No.: US 8,368,051 B2
(45) Date of Patent: Feb. 5, 2013

(54) COMPLEMENTARY BARRIER INFRARED DETECTOR (CBIRD)

(75) Inventors: David Z. Ting, Arcadia, CA (US); Sumith V. Bandara, Burke, VA (US); Cory J. Hill, Pasadena, CA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 662 days.

(21) Appl. No.: 12/501,167

(22) Filed: Jul. 10, 2009

(65) Prior Publication Data

US 2010/0006822 A1    Jan. 14, 2010

Related U.S. Application Data

(60) Provisional application No. 61/134,577, filed on Jul. 11, 2008.

(51) Int. Cl.
*H01L 31/00* (2006.01)
(52) U.S. Cl. ............... 257/21; 257/22; 257/E31.032; 257/E31.033
(58) Field of Classification Search ......... 257/21, 257/22, E31.032, E31.033
See application file for complete search history.

(56) References Cited

U.S. PATENT DOCUMENTS

| 5,194,983 A | * | 3/1993 | Voisin ..................... 359/245 |
| 2002/0027238 A1 | * | 3/2002 | Lin et al. .................. 257/292 |

OTHER PUBLICATIONS

Darin Hoffman et al., "The Effect of Doping the M-Barrier in Very Long-Wave Type-II inAs/GaSb Heterodiodes", Applied Physics Letters 93, 031107 (2008) pp. 1-3.
Binh-Minh Nguyen et al., "Dark Current Suppression in Type II InAs/GaSb Superlattice Long Wavelength Infrared Photodiodes With M-Structure Barrier" Applied Physics Letters 91, 163511 (2007) pp. 1-3.
Binh-Minh Nguyen et al., "Background Limited Long Wavelength Infrared Type-II InAs/GaSb Superlattice Photodiodes Operating At 110 K", Applied Physics Letters 93, 123502 (2008), pp. 1-3.
M. Carras et al., "Interface Band gap Engineering in InAsSb Photodiodes", Applied Physics Letters 87, 102103 (2005) pp. 1-3.
S. Maimon et al., "nBn Detector, An Infrared Detector With Reduced Dark Current and Higher Operating Temperature",Applied Physics Letters 89, 151109 (2006), pp. 1-3.

* cited by examiner

*Primary Examiner* — Tu-Tu Ho
(74) *Attorney, Agent, or Firm* — Kauth, Pomeroy, Peck & Bailey LLP

(57) ABSTRACT

An infrared detector having a hole barrier region adjacent to one side of an absorber region, an electron barrier region adjacent to the other side of the absorber region, and a semiconductor adjacent to the electron barrier.

15 Claims, 2 Drawing Sheets

COMPLEMENTARY BARRIER INFRARED DETECTOR (CBIRD)

PRIORITY CLAIM

This application claims the benefit of U.S. Provisional Application No. 61/134,577, filed Jul. 11, 2008.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to infrared detectors.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
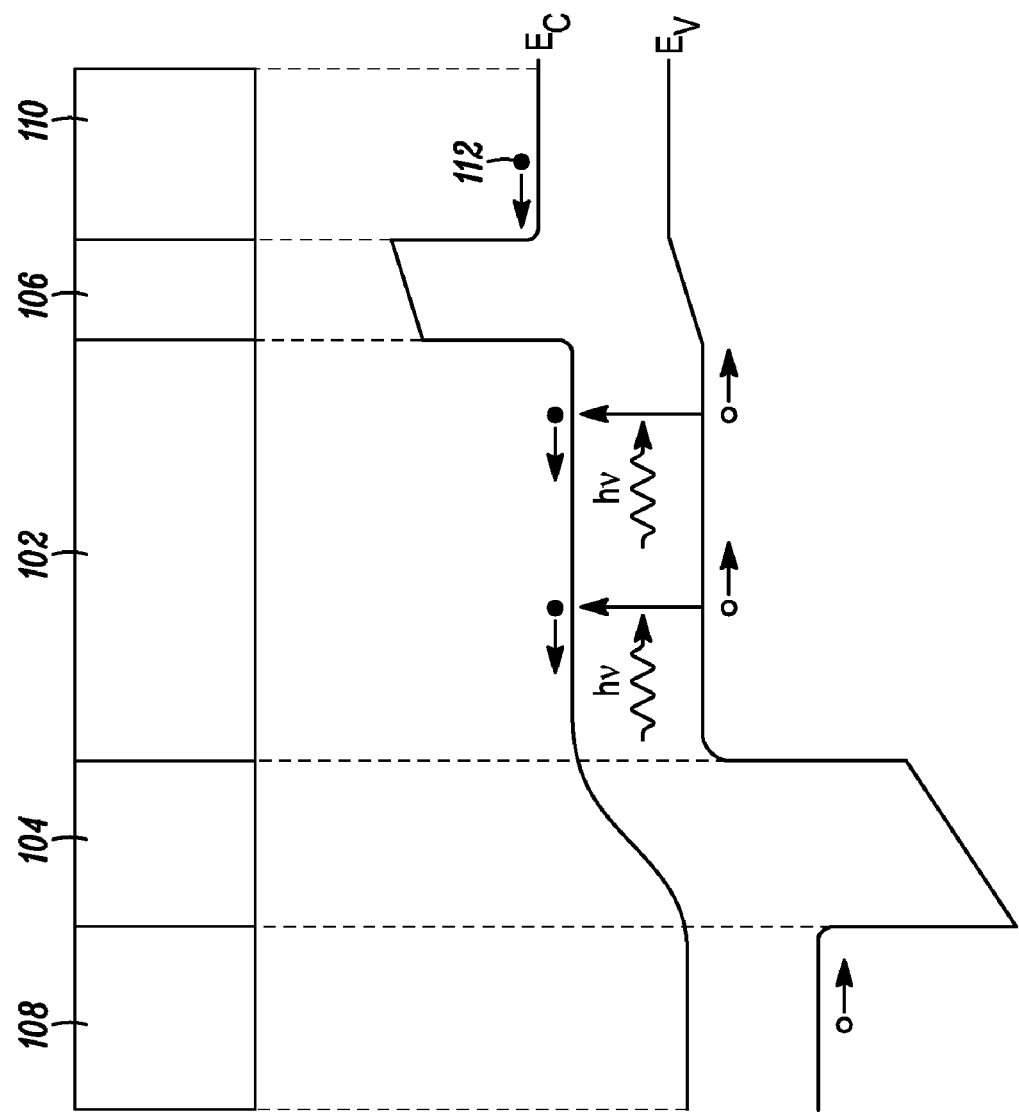
FIG. 1 illustrates an infrared detector, with a representative energy band diagram, according to an embodiment.

FIG. 1 illustrates an infrared detector according to an embodiment, comprising infrared absorber region 102, hole barrier region 104 on one side of infrared absorber region 102, electron barrier region 106 on the other side of the infrared absorber region 102, and contact regions 108 and 110 in contact with hole barrier region 104 and electron barrier region 106, respectively. The illustration of the detector in FIG. 1 is pictorial in nature and is not necessarily drawn to scale. In practice, the various regions making up an embodiment may be epitaxial layers grown on a substrate.

The conduction and valence energy band levels for the infrared detector are illustrated below their corresponding regions, with the conduction band edge labeled with an $E_C$ and the valence band edge labeled with an $E_V$. The dashed lines mark the various regions so as to provide a correspondence from the energy band diagrams to regions 102, 104, 106, 108, and 110. The regions and energy bands are not necessarily drawn to scale.

For the part of the energy bands corresponding to infrared absorber region 102, the absorption of light is pictorially represented by the wavy lines with "hv" above them to represent the photon energy, where h is Planck's constant and v is the frequency of the incoming infrared radiation. The absorption of a photon excites an electron from the valence band to the conduction band, which is represented by the vertical arrows pointing from the valence band to the conduction band. The illustrated solid circles near the conduction band represent electrons, and the illustrated hollow circles near the valence band represent holes. An arrow next to an electron or a hole pictorially represents the direction of the electron or hole under a bias voltage applied between contact regions 110 and 108, where contact region 108 is biased positively with respect to contact region 110.

Electrons are collected at contact region 108, and holes are collected at contact region 110. The bias voltage applied to contact regions 108 and 110 depends upon the type of material used, and some embodiments may operate at zero bias voltage. For example, with contact region 110 comprising a p-doped semiconductor and contact region 108 comprising an n-doped semiconductor, contact region 108 may be positively biased with respect to contact region 110 for some embodiments.

FIG. 1 illustrates a unipolar hole barrier in the valence energy band corresponding to hole barrier region 104, and a unipolar electron barrier in the conduction energy band corresponding to electron barrier region 106. The unipolar electron barrier region 106 blocks electrons from absorber region 102, but allows the flow of holes from absorber region 102. Similarly, the unipolar hole barrier region 104 blocks holes from absorber region 102, but allows the flow of electrons from absorber region 102. Contact region 108 is adjacent to hole barrier region 104 for collecting electrons, and contact region 110 is adjacent to electron barrier region 106 for collecting holes. Because of this placement, these complementary barriers do not impede the flow of photon-induced current (photo-current), and it is believed that a number of benefits may result from their use. These benefits are discussed below.

A prior art infrared detector, such as for example an n-π-p detector, may suffer from generation-recombination (G-R) current due to the Shockley-Read-Hall (SRH) process taking place in the space-charge region, where for example in a n-π-p detector a space-charge region is between the n-doped region and the π absorber region. Because wide band gap barriers (regions 104 and 106) in the embodiment of FIG. 1 are adjacent to absorber region 102, a significant reduction in SHR generated dark current is expected.

The use of wide band gap barriers is expected to help reduce thermally generated minority carriers in the diffusion wings from contributing to the photo current. For example, electron 112 represents a thermally generated electron, but because of electron barrier region 106, the probability of electron 112 tunneling through hole barrier region 106 to contact region 108 is very small. Furthermore, photo-generated electrons in absorber region 102 diffusing in a direction toward contact region 110 are deflected back by electron barrier region 106 with very high probability; and photo-generated holes in absorber region 102 diffusing in a direction toward contact region 108 are deflected back by hole barrier region 104 with very high probability.

For some embodiments, contact regions 108 and 110 may comprise material so as to have a wider band gap than absorber region 102, thereby acting as a window to allow longer wavelength radiation to reach absorber region 102. For some embodiments, contact regions 108 and 110 may comprise material so as to have smaller band gaps than hole barrier region 104 and electron barrier region 106, so as to facilitate in making ohmic contacts to reduce contact resistance. For some embodiments, both contact regions 108 and 110 may be doped as either n-type or p-type. Some embodiments may not include one or both of these contact regions, in which case electrical contact is made directly to one or both of the barrier regions.

For some embodiments, some or all of regions 102, 104, and 106 may be superlattices. For some embodiments, absorber region 102 may be a superlattice designed for Auger suppression to further reduced dark current. Some or all of these superlattices may be chirped, and some of the regions may be graded by introducing an alloy composition grading. Some embodiments may have band offsets between some of the various regions. For example, one or both of the absorber-barrier interfaces may have staggered band offsets, or the barrier-contact interfaces may have nested band offsets, where the offsets are such that electrons and holes may flow unimpeded by these types of band offsets when contact region 104 is biased positively with respect to contact region 106. The doping levels of the barrier regions and absorber region 102 may be adjusted to control various device properties.

Figure 2:
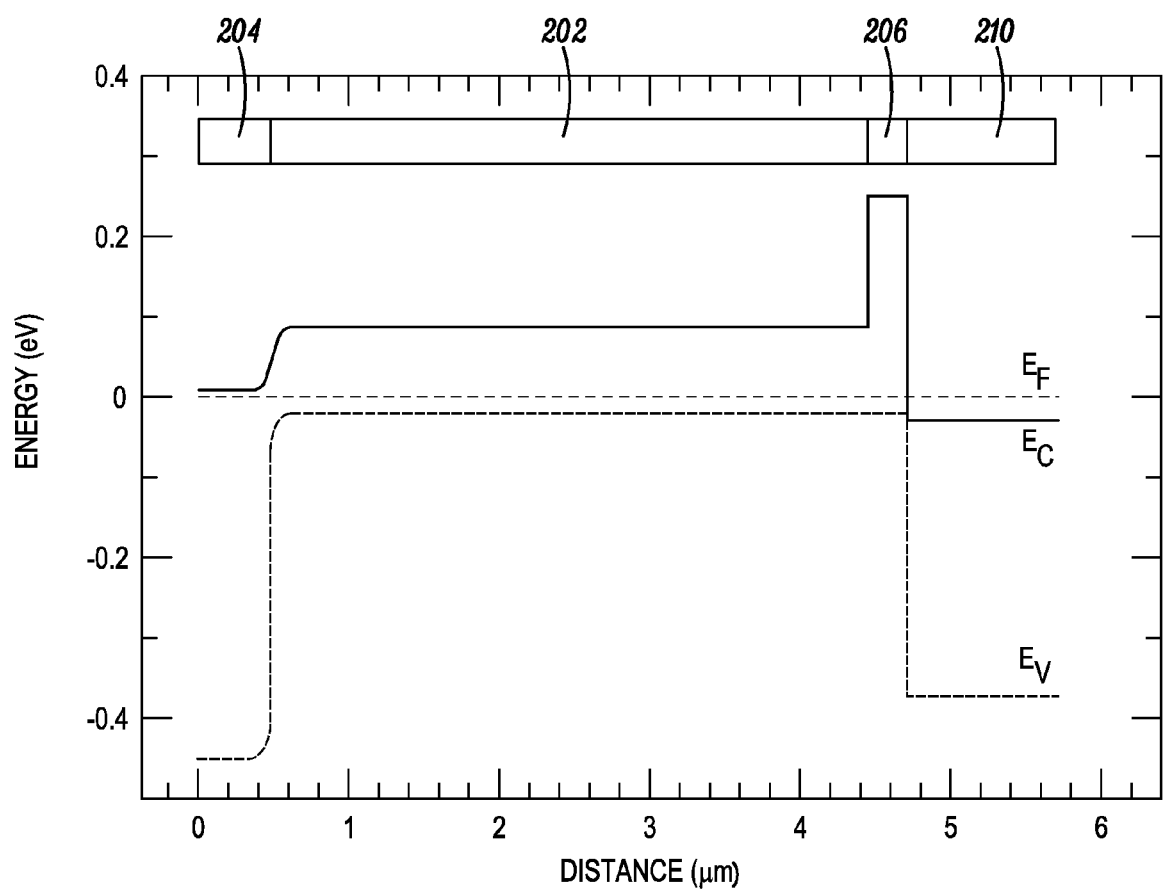
FIG. 2 illustrates an infrared detector, with an energy band diagram, according to another embodiment.

Energy band diagrams, including the Fermi level, for a specific example of an embodiment in which electrical contact is made directly to the hole barrier region are illustrated in FIG. 2. As in FIG. 1, a simplified view of the various regions making up an embodiment are shown with their corresponding energy band levels, but because electrical contact is made directly to hole barrier region 204, a contact region corresponding to contact region 108 is not needed.

For the embodiment of FIG. 2, contact region 210 has a wider band gap than absorber region 202 and is doped n-type. Electron barrier region 206 for the embodiment of FIG. 2 is doped p-type. Having an n-type contact region next to electron barrier region 206 creates a second p-n junction (the first being the one between hole barrier region 204 and absorber region 202) over which an applied voltage bias drop may be developed. This reduces the voltage drop over absorber region 202, thereby reducing dark current generation in absorber region 202.

For the embodiment of FIG. 2, absorber region 202, hole barrier region 204, and electron barrier region 206 are superlattice structures. Contact region 210 for collecting holes comprises InAsSb. These regions are shown in HG. 2 with their corresponding energy bands, where the y-axis is energy in electron volts (eV), and the x-axis denotes distance in microns, and where the origin of the x-axis is taken at the left hand side of hole barrier region of 204. Note that the embodiment illustrated in FIG. 2 does not have a contact layer for collecting electrons, but rather an ohmic contact may be made directly to hole barrier region 204 for collecting electrons. As illustrated in FIG. 2, the layer 210 could be made of a material such that the conduction band of the layer 210 overlaps with the valence band of the electron barrier 206 to facilitate the removal of excess holes from the absorber region 202.

In the particular embodiment of FIG. 2, absorber region 202 is a 600 period (44 Å, 21 Å) InAs/GaSb superlattice structure. That is, a structure comprising a 44 Å thick InAs layer adjacent to a 21 Å thick GaSb layer is repeated 600 times along the x-axis. Hole barrier region 204 is an 80 period (46 Å, 12 Å) InAs/AlSb superlattice, and electron barrier region 206 is a 60 period (22 Å, 21 Å) InAs/GaSb superlattice. For the particular embodiment of FIG. 2, hole barrier region 204 and electron barrier region 206 are designed to have, respectively, an approximately zero conduction sub-band offset with respect to absorber region 202 and an approximately zero valence sub-band offset with respect to absorber region 202. Hole barrier region 204 is nominally doped at $n=1 \cdot 10^{16}$ cm$^{-3}$, absorber region 202 is nominally doped at $p=1 \cdot 10^{16}$ cm$^{-3}$, and electron barrier region 206 is nominally doped at $p=1 \cdot 10^{16}$ cm$^{-3}$. Contact region 210 is an $n=1 \cdot 10^{18}$ cm$^{-3}$ doped InAs$_{0.91}$Sb$_{0.09}$ layer. The particular embodiment illustrated in FIG. 2 was grown on a 50-mm diameter Te-doped GaSb (100) substrate in a molecular beam epitaxial chamber. These parameters are cited merely as an example embodiment.

For some embodiments, contact region 210 may serve as a bottom contact layer, and hole barrier region 204 may serve as a top contact layer. For a positive bias applied to hole barrier region 204 with respect to contact region 210, the voltage drop is can take place over the junction formed by electron barrier region 206 and contact region 210. This junction is away from absorber region 202, thereby mitigating dark current generation. In general, for a non-negative bias applied to hole barrier region 204 with respect to contact region 210, photo generated minority carriers (electrons) in absorber region 202 diffuse or drift towards hole barrier region 204 to be collected by a contact applied to hole barrier region 204. The excess hole population redistributes by dielectric relaxation, and may recombine with electrons injected into absorber region 202 from contact region 210.

Various modifications may be made to the disclosed embodiments without departing from the scope of the invention as claimed below.

What is claimed is:

1. A detector comprising:
   a p-type absorber region to generate electrons and holes in response to electromagnetic radiation;
   a unipolar hole barrier region having inner and outer ends and disposed such that the inner end is positioned adjacent to the absorber region;
   a first n-type contact region disposed adjacent to the outer end of the hole barrier comprising a semiconductor material that allows the un-impeded flow of minority carriers from the absorber region;
   a unipolar electron barrier region having inner and outer ends and disposed such that the inner end is positioned adjacent to the absorber region; and
   a second contact region disposed adjacent to the outer end of the electron barrier, comprising a semiconductor material that allows the un-impeded flow of majority carriers from the absorber region
   wherein the absorber region, the unipolar hole barrier region and the unipolar electron barrier region are all substantially lattice-matched to a semiconductor substrate; and
   wherein the energy band gap of the barriers between the absorber and the contacts are selected such that the undesirable generation-recombination (G-R) dark current produced through the Shockley-Read-Hail (SRH) processes is reduced.

2. The detector as set forth in claim 1, wherein the absorber region, the hole barrier region, and the electron barrier region are selected from the group consisting of a bulk semiconductor and a superlattice semiconductor.

3. The detector as set forth in claim 2, wherein the absorber region comprises an InAs/GaSb superlattice semiconductor.

4. The detector as set forth in claim 3, wherein the hole barrier region comprises an InAs/AlSb superlattice semiconductor.

5. The detector as set forth in claim 4, wherein the electron barrier region comprises an InAs/GaSb superlattice semiconductor.

6. The detector as set forth in claim 5, wherein the absorber region is a 600 period (44 Å, 21 Å) superlattice semiconductor.

7. The detector as set forth in claim 6, wherein the absorber region is a 600 period (44 Å, 21 Å) superlattice, the hole barrier region is an 80 period (46 Å, 12 Å) superlattice, and the electron barrier region is a 60 period (22 Å, 21 Å) superlattice.

8. The detector as set forth in claim 1, wherein the first contact region has a wider band gap than that of the absorber region.

9. The detector as set forth in claim 1, wherein the electron barrier region comprises a p-type doped semiconductor.

10. The detector as set forth in claim 9, wherein the hole barrier region comprises an n-type doped semiconductor, and the absorber region comprises a p-typed doped semiconductor.

11. The detector as set forth in claim 1, wherein the electromagnetic radiation is infrared.

12. The detector as set forth in claim 1, wherein the first n-type contact is formed by the unipolar hole barrier.

13. The detector as set forth in claim 1, wherein the second contact is a p-type contact.

14. The detector as set forth in claim 1, wherein the second contact is an n-type contact in a broken gap alignment to the electron barrier.

15. A detector comprising:
- an n-type absorber region to generate electrons and holes in response to electromagnetic radiation;
- a unipolar electron barrier region having inner and outer ends and disposed such that the inner end is positioned adjacent to the absorber region;
- a first p-type contact region disposed adjacent to the outer end of the electron barrier, comprising a semiconductor material that allows the un-impeded flow of minority carriers from the absorber region;
- a unipolar hole barrier region having inner and outer ends and disposed such that the inner end is positioned adjacent to the absorber region; and
- a second contact region disposed adjacent to the outer end of the hole barrier, comprising a semiconductor material that allows the un-impeded flow of majority carriers from the absorber region;
- wherein the absorber region, the unipolar hole barrier region and the unipolar electron barrier region are all substantially lattice-matched to a semiconductor substrate; and
- wherein the energy band gap of the barriers between the absorber and the contacts are selected such that the undesirable generation-recombination (G-R) dark current produced through the Shockley-Read-Hall (SRH) processes is reduced.

* * * * *